United States Patent [19]
Inaba

[11] Patent Number: 5,877,536
[45] Date of Patent: Mar. 2, 1999

[54] LEVEL SHIFTER CAPABLE OF STABLY PRODUCING A LEVEL SHIFTED VOLTAGE

[75] Inventor: Hideo Inaba, Kanagawa, Japan

[73] Assignee: NEC Corporation, Tokyo, Japan

[21] Appl. No.: 705,270

[22] Filed: Aug. 29, 1996

[30] Foreign Application Priority Data

Aug. 30, 1995 [JP] Japan ................................. 7-222379

[51] Int. Cl.[6] ............................................. H01L 29/72
[52] U.S. Cl. ........................ 257/379; 438/238; 438/382; 257/536
[58] Field of Search ........................ 438/238, 381–382, 438/171, 181; 257/379, 336, 344, 380, 370, 536

[56] References Cited

U.S. PATENT DOCUMENTS

| | | | |
|---|---|---|---|
| 4,879,505 | 11/1989 | Barrow et al. | 323/312 |
| 5,530,640 | 6/1996 | Hara et al. | |
| 5,801,418 | 9/1998 | Ranjan | 257/336 |

FOREIGN PATENT DOCUMENTS

| | | |
|---|---|---|
| 0 536 693 A2 | 4/1993 | European Pat. Off. |
| 43 34918A1 | 4/1994 | Germany . |
| 03196317 | 8/1991 | Japan . |
| 3196317 | 8/1991 | Japan . |

OTHER PUBLICATIONS

European Search Report, Dec. 4, 1997.

*Primary Examiner*—Jey Tsai
*Attorney, Agent, or Firm*—Whitham, Curtis & Whitham

[57] ABSTRACT

In a level shifter, first and second integrated-circuit resistors are connected in series between a source voltage supplying terminal and the ground. The first and the second integrated-circuit have a common temperature characteristic and a common line width. A third integrated-circuit is connected to the first integrated-circuit resistor in parallel and has another temperature characteristic. The first, the second, and the third integrated-circuit resistors form a voltage divider which divides a source voltage Vcc into a divided voltage. A differential amplifier has a noninverting terminal which is connected to a connection point between the first and the second integrated-circuit resistors, an output terminal, and a inverting terminal which is connected to the output terminal. The differential amplifier supplies the divided voltage to an integrated circuit as a level shifted voltage.

11 Claims, 3 Drawing Sheets

LEVEL SHIFTER CAPABLE OF STABLY PRODUCING A LEVEL SHIFTED VOLTAGE

BACKGROUND OF THE INVENTION

This invention relates to a level shifter which shifts or reduces a source voltage and produces a level shifted voltage. Specially, this invention relates to a level shifter which is formed within a semiconductor substrate together with an integrated circuit and which has a voltage dividing circuit.

Recently, an operating voltage of an integrated circuit tends to be lowered so as to reduce consumption of electric power with a rise of integrational rate and heating value of the integrated circuit. To this end, a level shifter has often been used which is formed within a semiconductor substrate together with such an integrated circuit to shift a source voltage.

With a reduction of the operating voltage, strict operational conditions are imposed on a semiconductor element of the integrated circuit. For example, when the operating voltage is higher than a designed voltage, the semiconductor element, such as a MOS transistor, deteriorates. When the operating voltage is lower than the designed voltage, an operating speed of the semiconductor element is reduced. This means that operating characteristics of the semiconductor element are easily influenced by an atmospheric temperature. In Japanese Patent Prepublication No. 196317/1991, proposal has been made about a conventional level shifter which has a predetermined temperature characteristic so as to alleviate or relieve an influence of the atmospheric temperature.

More specifically, the conventional level shifter has a voltage dividing circuit of two resistors which are connected to each other in series and which are farmed by a semiconductor integrated technique as integrated circuit elements. Such resistors will be called integrated-circuit resistors and have peculiar temperature characteristics in relation to the predetermined temperature characteristic. In the proposed level shifter, both the peculiar temperature characteristics of the integrated-circuit resistors are different from each other. Namely, the resistors have resistances which individually vary in dependency upon the atmospheric temperature. As a result, a divided voltage also varies in the dividing circuit in response to the atmospheric temperature. The conventional level shifter is operable to produce a level shifted voltage from the divided voltage. This shows that the level shifted voltage varies in dependency upon the atmospheric temperature.

In the conventional level shifter, both the integrated-circuit resistors should have different line widths because the integrated-circuit resistors establish peculiar temperature characteristics as mentioned before. This results in a large variation on manufacturing the level shifter. In addition, integrated-circuit resistors must be separately formed by different manufacturing process in order to have different temperature characteristics.

Therefore, the conventional level shifter can not produce a expected shifted source voltage.

SUMMARY OF THE INVENTION

It is therefore in object of this invention to provide a level shifter which is capable of stably producing an expected dropped source voltage.

It is another object of this invention to provide a level shifter which can mitigate or alleviate influence of a manufacturing accuracy.

Other objects of this invention will become clear as the description proceeds.

According to an aspect of this invention, a level shifter is formed within a semiconductor substrate which shifts a source voltage supplied with a source terminal so as to supply a level shifted voltage for a level shifted voltage supplying terminal. The level shifter comprises a first integrated-circuit resistor which is formed within the semiconductor substrate and which has a first temperature characteristic and a first line width. A second integrated-circuit resistor is formed within the semiconductor substrate and is connected between the source terminal and the first integrated-circuit resistor and has a second temperature characteristic and a second line width which are equal to the, first temperature characteristic and the first line width, respectively. A third integrated-circuit resistor is formed within the semiconductor substrate and is connected to the second integrated-circuit resistor in parallel and has a third temperature characteristic which is different from each of the first and the second temperature characteristics. The third integrated-circuit resistor divides the source voltage together with the first and the second integrated-circuit resistors and produces a divided voltage. Output means is formed within the semiconductor substrate and is connected to a common point of connection among the first, the second, and the third integrated-circuit resistors and the level shifted voltage supplying terminal and supplies the dividing voltage for the level shifted voltage supplying terminal as the level shifted voltage.

According to another aspect of this invention, a revel shifter is formed within a semiconductor substrate so as to shift a source voltage supplied with a source terminal and supply a level shifted voltage for a level shifted voltage supplying terminal. The level shifter comprises a first integrated-circuit resistor which is formed within the semiconductor substrate and which has a first temperature characteristic and a first line width. A second integrated-circuit resistor is formed within the semiconductor substrate and is connected between the level shifted voltage supplying terminal and the first integrated-circuit resistor and which has a second temperature characteristic and a second line width which are equal to the first temperature characteristic and the first line width, respectively. A third integrated-circuit resistor is formed within the semiconductor substrate and is connected to the first integrated-circuit resistor in parallel and has a third temperature characteristic which is different from each of the first and the second temperature characteristics. The third integrated-circuit resistor divides the level shifted voltage together with the first and the second integrated-circuit resistors and produces a divided voltage. A constant voltage generating circuit formed on said semiconductor substrate for generating a constant voltage. A differential amplifier is formed within the semiconductor substrate and has a noninverting terminal which is connected to the constant voltage generating circuit, a inverting terminal which is connected to a common point of connection among the first, the second, and the third integrated-circuit resistors, and an output terminal. The differential amplifier produces a control voltage in response to the constant voltage and the divided voltage. A transistor is formed within the semiconductor substrate and is connected to the source terminal, the level shifted voltage supplying terminal, and the output terminal. The transistor shifts the source voltage in response to the control voltage to supply the level shifted voltage for the level shifted voltage supplying terminal.

DESCRIPTION OF THE PREFERRED EMBODIMENT

Figure 1:
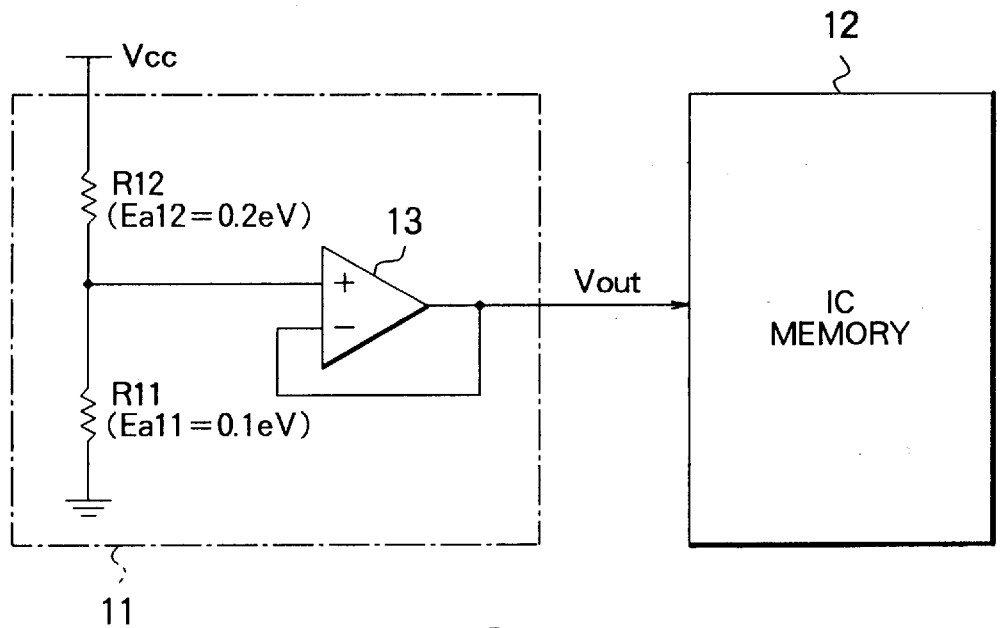
FIG. 1 is a circuit diagram of a conventional level shifter.
Figure 2:
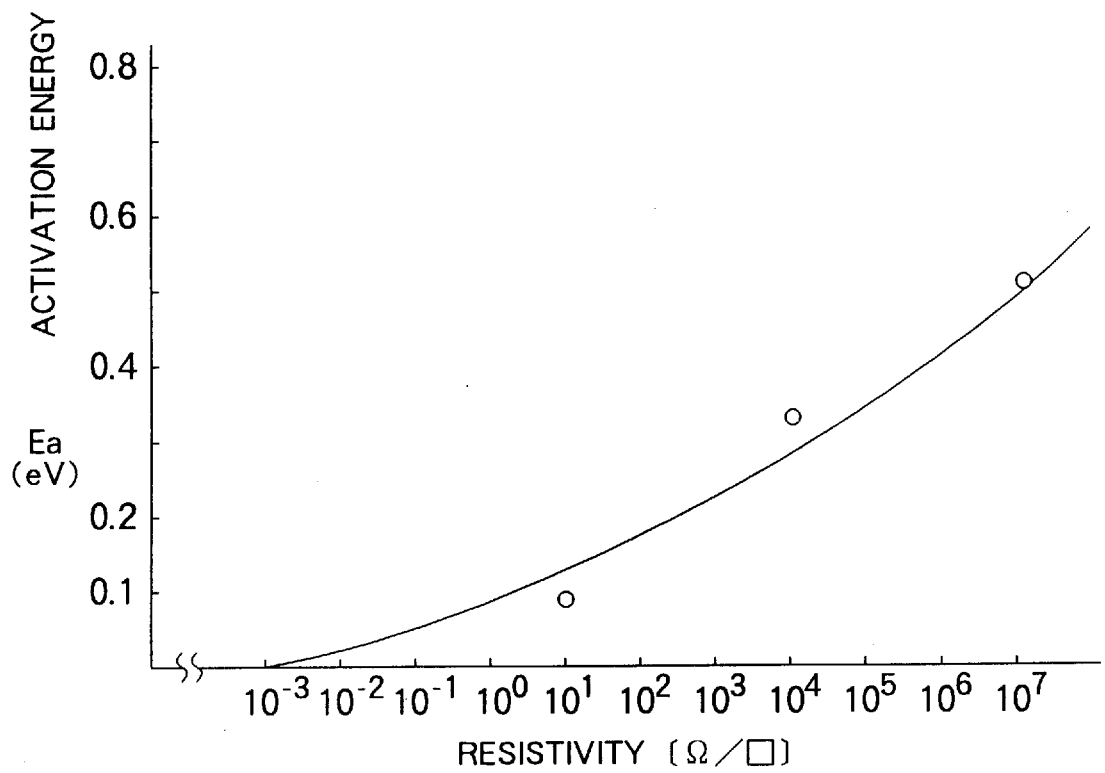
FIG. 2 is a graph representative of a relationship between resistivity and activation energy.

Referring to FIG. 1 through FIG. 2, description will be at first directed to a conventional level shifter for a better understanding of this invention.

In FIG. 1, the conventional level shifter 11 is formed by a semiconductor integrated technique on a semiconductor substrate (not shown) together with a integrated circuit 12, such as a semiconductor memory. The conventional level shifter 11 comprises a first resistor R11 which is connected to the ground and which has a first resistance value and first temperature characteristic. A second resistors R12 is connected between a source voltage supplying terminal (source voltage Vcc) and the first resistor R11 and has a second resistance value and a second temperature characteristic which is different from the first temperature characteristic. The first and the second resistors R11 and R12 form a voltage divider which divides the source voltage Vcc into a divided voltage. A differential amplifier 13 has a noninverting input terminal which is connected to a common point of connection between the first and the second resistor R11 and R12, an inverting terminal, and an output terminal. The inverting input terminal is connected to the output terminal. The output terminal is also connected to the integrated circuit 12 so as to supply the divided voltage to the integrated circuit 12 as an output voltage Vout.

Generally, a resistor which is manufactured by the semiconductor integrated technique comprises a polycrystalline silicon layer. The polycrystalline silicon layer has a resistivity which depends on an impurity concentration or a dose of impurities. Namely, the resistivity can be controlled by doping an amount of impurities in the polycrystalline silicon layer. Moreover, the polycrystalline silicon layer has a temperature characteristic which is expressed as follows;

$$R = R0 * \exp(Ea/kT),$$

where:

R=resistance value of the resistor;

R0=a constant decided by a structure of the polycrystalline silicon layer;

k=a Boltzmann constant ($8.61 * 10^{-5}$ [eV/°K]);

T=a temperature of Kelvin scale; and

Ea activation energy decided by the structure of the polycrystalline silicon layer.

A relationship of the resistivity and the activation energy Ea at normal temperature (300 [°K]) is shown in FIG. 2. As shown in FIG. 2, when the resistivity becomes large, the activation energy Ea also becomes large.

Returning back to FIG. 1, it is assumed that the conventional revel shifter reduces the source voltage Vcc of 5 [V] into the output voltage Vout of 4 [V] at a normal temperature of 300 [°K] and reduces-the source voltage Vcc of 5 [V] into the output voltage Vout of 4.6 [V] at a temperature of 400 [°K]. In addition, it is assumed that current through the first and the second resistors is smaller than 0.5 [mA] when the source voltage Vcc is equal to 5 [V] at the normal temperature of 300 [°K]. In this case, the first resistor R11 has the first resistance value of 8 [kΩ], a first resistivity of 3 [Ω/□], and first activation energy Ea11 of 0.1 [eV]. The second resistor R12 has the second resistance value of 2 [kΩ], a second resistivity of 148 [Ω/□], and second activation energy Ea12 of 0.2 [eV].

If the first and the second resistors R11 and R12 have a common line width of 1 [μm], then the first and the second resistors R11 and R12 have a first length of 2667 [μm] and a second length of 13.7 [μm], respectively. Because the first length and the second length are extremely different from each other, the second resistor R12 is generally formed so as to have a line width which is wider than a line width of the first resistors R11. For example, the second resistor R12 has the line width of 10 [μm] when the first resistor R11 has the line width of 1 [μm].

The first and the second resistors R11 and R12 are formed during individual processes by doping different doses of impurities in a polycrystalline silicon layer even when a mask which is manufactured by an identical etching process is used to limit regions of the doping and to decide the line widths of the first and the second resistors R11 and R12. In the etching process of manufacturing the mask, a first variation occurs in size of the openings in the mask. The first variation adversely affects the line widths of the first and the second resistors R11 and R12 and might give rise to variations of the resistances of the first and the second resistors R11 and R12 from designed values. The first variation does not substantially influence the lengths of the first and the second resistors R11 and R12, because metal contacts are formed on the polycrystalline silicon layer at longitudinal ends of the first and the second integrated-circuit resistors R11 and R12.

Now, it is considered that the first variation influences the output voltage Vout. The output voltage Vout is expressed as follows:

$$Vout = R11 * Vcc/(R11 + R12),$$

where:

R11=first resistance value of the first resistor;

R12=second resistance value of the second resistor; and

Vcc=the source voltage.

If the first and the second resistor R11 and R12 have the above-exemplified value and the first variation falls with in a range from −0.1 [μm] to +0.1 [μm], the first and the second resistance values vary about 10 percent.

If the first variation takes a value of −0.1 [μm], the output voltage Vout becomes as follows:

$$\begin{aligned} Vout &= R11 * Vcc/(R11 + R12) \\ &\approx (8 + 0.8) * 5/((8 + 0.8) + (2 + 0.02)) \\ &= 4.067 \,[V]. \end{aligned}$$

Similarly, when the first variation takes a value of +0.1 [μm], the output voltage Vout becomes as follows:

$$\begin{aligned} Vout &= R11 * Vcc/(R11 + R12) \\ &\approx (8 - 0.8) * 5/((8 - 0.8) + (2 - 0.02)) \\ &= 3.92 \,[V]. \end{aligned}$$

Accordingly, the output voltage Vout has a range from 3.922 to 4.067 [V]. A first maximum variation of the output voltage Vout is 0.08 [V]. This shows that about 12 percents of the change occur in the output voltage Vout when the atmospheric temperature is changed from 300 [°K] to 400 [°K].

In the doping process, a first doping process is carried out to form the first resistor R11 in the semiconductor substrate. In this doping process, a second variation inevitably occurs about an impurity concentration of the first resistor R11. Specifically, the second variation brings about a variation of the first activation energy Ea11. If the first activation energy Ea11 is varied by ±2 percents, then the first resistance value is changed within a range from 7.57 to 8.86 [kΩ].

Similarly, a second doping process is carried out for the second resistor R12. In this doping process, a third variation takes place in an impurity concentration of the second resistor R12. The third variation results in a variation of the second activation energy Ea12. If the second activation energy Ea12 is changed within a range from −2 percents to +2 percents, then the second resistance values varies from 1.71 [kΩ] to 2.32 [kΩ].

Therefore, the output voltage Vout is changed within a range from 3.83 to 4.19 [V]. In this case, a second maximum variation of the output voltage Vout is 0.19 [V]. This shows that about 33 percents of the output voltage Vout are changed due to the change of the atmospheric temperature from 300 [°K] to 400 [°K].

These variations of the output voltage Vout influences an operation of the integrated circuit 12.

Figure 3:
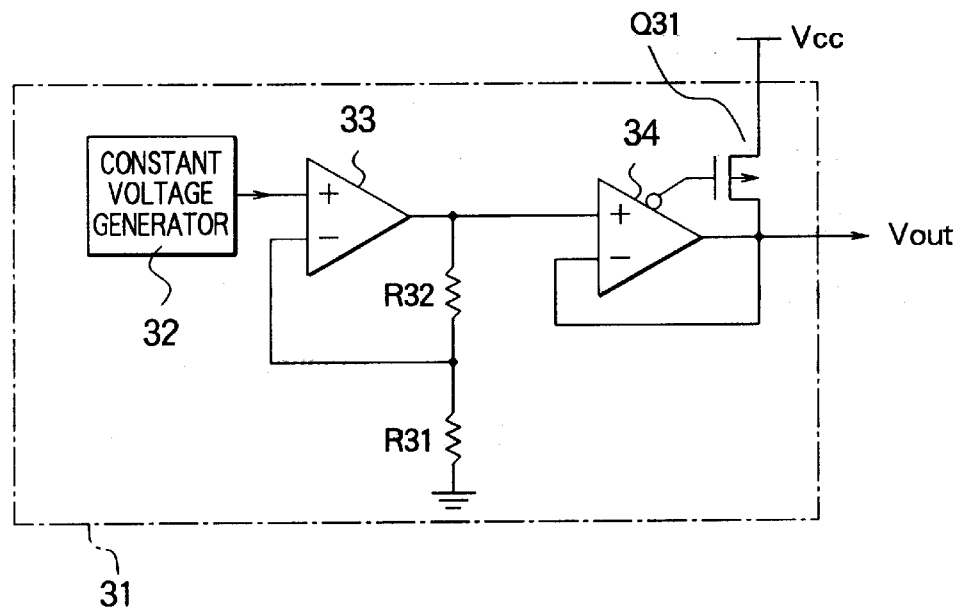
FIG. 3 is a circuit diagram of another conventional level shifter.

Referring to FIG. 3, another conventional level shifter 31 will be described in the following.

The conventional level shifter 31 is formed so as not to be influenced by change of a source voltage Vcc The conventional level shifter 31 comprises a constant voltage generating circuit 32 which generates a constant voltage. A first resistor R31 is connected to the ground. A second resistor R32 is connected to the first resistor R31 in series so as to form a voltage divider together with the first resistor R31. A first differential amplifier 33 has a first noninverting input terminal which is connected to the constant voltage generating circuit 32, a first inverting input terminal which is connected to a common point of connection between the first and the second resistors R31 and R32, and a first output terminal is connected to the second resistor R32. A second differential amplifier 34 has a second noninverting input terminal which is connected to the first output terminal, a second inverting input terminal which is connected to a level shifted voltage supplying terminal, and a second output terminal which is connected to the second inverting input terminal and the level shifted voltage supplying terminal. A transistor Q31 is connected to a source voltage supplying terminal (source voltage Vcc), the second output terminal, and a bias terminal of the second differential amplifier 34.

In the conventional level shifter 31, the first and the second resistors R31 and R32 are formed by a doping process like the doping process which is used for manufacturing the conventional level shifter 11 of FIG. 1. Therefore, the output voltage Vout of the level shifter 31 is varied like the output voltage of the conventional level shifter 11.

In addition, the conventional level shifter 31 includes many elements and is complicated in structure.

Figure 4:
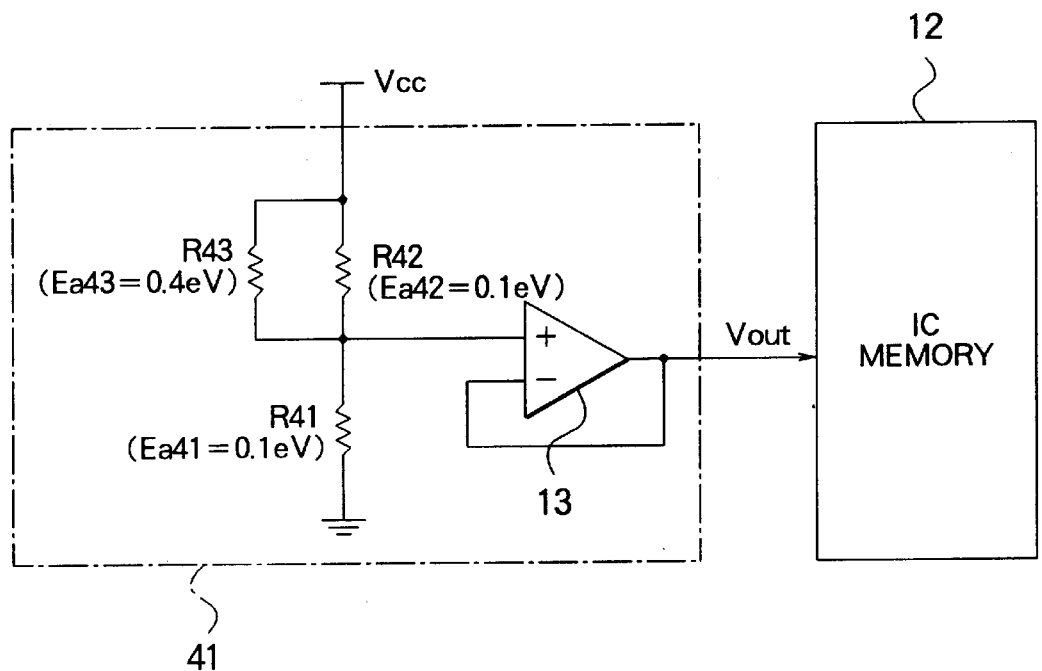
FIG. 4 is a circuit diagram of a level shifter according to a first embodiment of this invention.

Referring to FIG. 4, description will be made about a level shifter 41 according to a first embodiment of this invention similar parts are designated by like reference numerals.

In FIG. 4, the level shifter 41 is formed within a semiconductor substrate (not shown) together with an integrated circuit 12. The level shifter 41 comprises a first resistor R41 which is connected to the ground and which has a first resistance value, first temperature characteristic, and a first line width. A second resistor R42 is connected between a source voltage supplying terminal (source voltage Vcc) and the first resistor R41 and has a second resistance value, a second temperature characteristic, and a second line width. The second temperature characteristic and the second line width are substantially equal to the first temperature characteristic and the first line width, respectively.

Moreover, a third resistor R43 is connected to the second resistor R42 in parallel and has a third resistance value, a third line width, and a third temperature characteristic-which is different from each of the first and the second temperature characteristics. The first, the second, and the third resistors R41, R42, and R43 form a voltage divider which divides the source voltage Vcc to produce a divided voltage.

A differential amplifier 13 is connected to a common point of connection among the first, the second, and the third resistors R41, R42, and R43 so as to supply the divided voltage to the integrated circuit 12 as an output voltage Vout.

It is assumed that the level shifter 41 shifts the source voltage Vcc of 5 [V] to the output voltage Vout of 4 [V] at a normal temperature of 300 [°K] and also shifts the source voltage Vcc of 5 [V] to the output voltage Vout of 4.6 [V] at a high temperature of 400 [°K]. Moreover, it is assumed that the first, the second, and the third resistors R41, R42, and R43 are formed by a polycrystalline silicon and have first, second, and third temperature characteristics, respectively.

Under the circumstances, let the first resistor R41 have the first resistance value of 8 [kΩ] and a first activation energy Ea41 of 0.1 [eV]. Likewise, let the second resistor R42 have the second resistance value of 2.2 [kΩ] and a second activation energy Ea42 of 0.1 [eV]. In addition, let the third resistor R43 have the third resistance value of 20 [kΩ] and a third activation energy Ea43 of 0.4 [eV].

When the first and the second resistors R41 and R42 have a common line width of 1 [µm], they may have lengths of 2667 [µm] and 733 [µm], respectively. When the third resistor R43 has the third line width of 34 [µm], it may have a length of 2 [µm].

It is considered that the line widths are varied from designed widths during an etching process of manufacturing the level shifter 41. If the variation ranges from −0.1 to +0.1 [µm], then the first and the second resistance values are varied by about 10 percents. On the other hand, the third resistance value is scarcely influenced by the variation of the third line width because the third line width of 34 [µm] is considerably wider than the variation.

When the variation is equal to −0.1 [µm], a total or combined resistance value R42–43 of the second and the third resistor R42 and R43 is expressed as follows:

$$R42\text{-}43 = R42*R43/(R42+R43)$$
$$\approx (2.2+0.22)*20/(2.2+0.22+20)$$
$$= 2.159 \, [k\Omega],$$

where:

R42=a second resistance value of the second resistor; and
R43=a third resistance value of the third resistor.

When the variation is equal to +0.1 [µm], the combined resistance value R42–43 is expressed as follows:

$$R42\text{-}43 = R42*R43/(R42+R43)$$
$$\approx (2.2-0.22)*20/(2.2-0.22+20)$$
$$= 1.802 \, [k\Omega].$$

Accordingly, when the variation is equal to −0.1 [µm], the output voltage Vcc is expressed as follows:

$$\begin{aligned}
V_{out} &= R41 * V_{cc}/(R41 + R42\text{-}43), \\
&\approx (8 + 0.8)*5/(8 + 0.8 + 2.159) \\
&= 4.015 \, [V].
\end{aligned}$$

where:

R41=a first resistance value of the first resistor; and

Vcc=the source voltage.

On the other hand, when the variation is equal to +0.1 [μm], the output voltage Vcc is expressed as follows:

$$\begin{aligned}
V_{out} &= R41 * V_{cc}/(R41 + R42\text{-}43), \\
&\approx (8 - 0.8)*5/(8 - 0.8 + 1.802) \\
&= 3.999 \, [V].
\end{aligned}$$

Therefore, the output voltage Vcc is changed within a range from 3.999 to 4.015 [V]. A first maximum variation of the output voltage Vout is equal to 0.015 [V]. This means that only 2.5 percents of the output voltage Vout is varied in response to the change of temperature from 300 [°K] to 400 [°K]. Such a variation of the output voltage Vout does not practically influence the operation of the integrated circuit 12.

Next, it is considered that the activation energies Ea41, Ea42, and Ea43 have variations are varied in doping processes of manufacturing the level shifter 41. The first activation energy Ea41 and the second activation energy Ea42 are equal to each other, because the first and the second resistors R41 and R42 are formed by the same doping process. The third activation energy Ea43 and the first activation energy Ea41 are not always equal to each other, because the third resistors R43 is formed by another doping process.

If each of the variations ranges from −2 percents to +2 percents, then the first resistance value ranges from 7.57 to 8.85 [kΩ], the second resistance value ranges from 2.08 to 2.43 [kΩ], and the third resistance value ranges from 14.7 to 27.3 [kΩ]. In this event, a combined resistance value of the second and the third resistance ranges from 2.085 to 2.231 [kΩ] when the variation of the second activation energy Ea42 is equal to +2 percents. The combined resistance value ranges from 1.822 to 1.933 [kΩ] when the variation of the second activation energy Ea is equal to −2 percents. As a result, the output voltage Vout ranges from 3.993 to 4.047 [V] when the variation of the first activation energy Ea is equal to +2 percents. On the other hand, the output voltage Vout ranges from 3.983 to 4.030 [V] when the variation of the first activation energy Ea41 is equal to −2 percents. Namely, the output voltage Vout ranges from 3.983 to 4.047 [V]. A second maximum variation of the output voltage Vout is equal to 0.047 [V]. This shows that about 7.8 percent of the output voltage Vout is change in response to the change of temperature from 300 [°K] to 400 [°K]. The variation of the output voltage Vout does not practically influence the operation of the integrated circuit 12.

Since the third resistance value is greater than the second resistance value, the variation of the output voltage Vout becomes very small.

Figure 5:
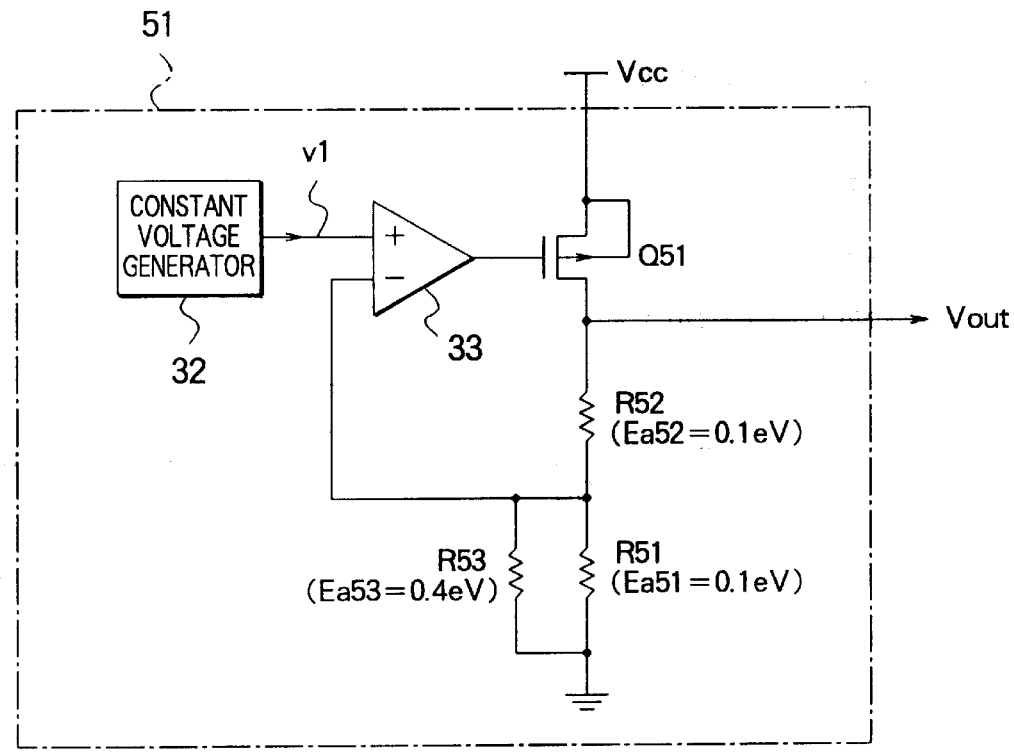
FIG. 5 is a circuit diagram of a level shifter according to a second embodiment of this invention.
Figure 6:
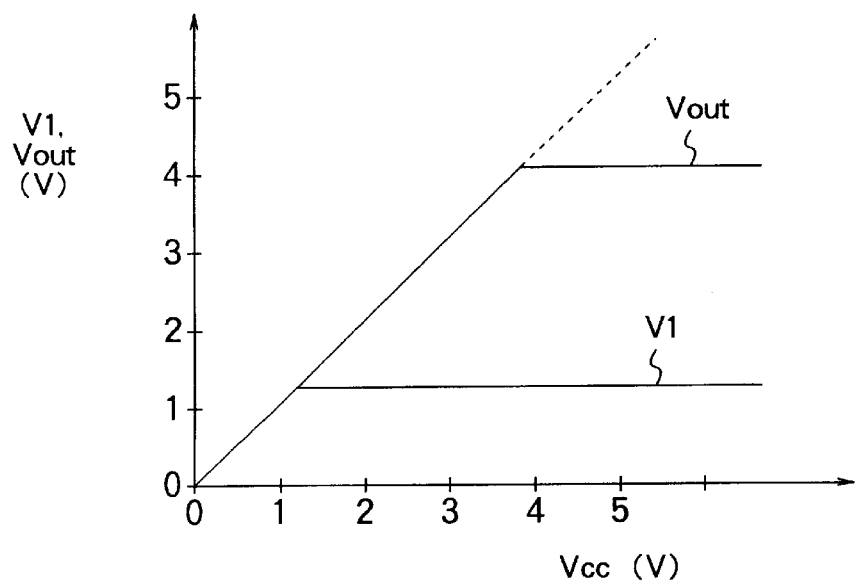
FIG. 6 is a graph representative of a relationship between a source voltage Vcc and an output voltage Vout in the level shifter of FIG. 5.

Referring to FIGS. 5 and 6, description will be made about a level shifter according to a second embodiment of this invention.

In FIG. 5, a level shifter 51 is formed within a semiconductor substrate (not shown) and comprises a constant voltage generating circuit 32 which generates a constant voltage. A first resistor R51 is connected to the ground and has a first resistance value, a first temperature characteristic, and a first line width. A second resistor R52 is connected to the first-integrated-circuit resistor R51 in series and to an output voltage supplying terminal for supplying an output voltage Vout to an integrated circuit (not shown in this figure).

The second resistor R52 has a second resistance value, a second temperature characteristic, and a second line width. The second temperature characteristic and the second line width are equal to the first temperature characteristic and the first line width, respectively.

A third resistor R53 is connected to the first integrated-circuit resistor R51 in parallel so as to form a voltage divider together with the first and the second resistors R51 and R52. The third-resistor R53 has a third resistance value, a third temperature characteristic, and a third line width. The third temperature characteristic is different from the first and the second temperature characteristics.

A differential amplifier 33 has a noninverting input terminal which is connected to the constant voltage generating circuit 32, an inverting input terminal which is connected to a common point of connection among the first, the second, and the third resistors R51, R52, and R53, and an output terminal. A transistor Q51 is connected to a source voltage supplying terminal (source voltage Vcc), the first output terminal of the differential amplifier 33, and the output voltage supplying terminal.

Herein let the constant voltage generating circuit 32 generate a constant voltage of 1.3 [V]. In addition, the first, the second, and the third resistors have the first through the third resistance values of 3.9 [kΩ], 8 [kΩ], and 270 [kΩ], respectively, and activation energies Ea51 of 0.1 [eV], Ea52 of 0.1 [eV], and Ea53 of 0.4 [eV]. Each activation energy Ea51, Ea52, and Ea53 decides the first, the second, and the third temperature characteristics. In this structure, the level shifter shifts the source voltage of 5 [V] to the output voltage Vout of 4.0 [V] at a normal temperature of 300 [°K] and to the output-voltage Vout of 4.0 [V] at a high temperature of, for example, 400 [°K].

If the first and the-second line widths are equal to 1[μm], the first and the second resistors R51 and R52 have lengths of 1300 [μm] and 2667 [μm], respectively. If the third line width is equal to 2.5 [μm], the third resistor R53 has a length of 2 [μm].

The first, the second, and the third resistors R51, R52, and R53 are formed by using of a mask which has openings formed by a single etching process. Moreover, the first and the second resistors R51 and R52 ate formed by using of a single doping process. Accordingly, a divided voltage produced by the voltage divider are rarely varied like in the output voltage Vout of the level shifter 41 of FIG. 4.

In the illustrated example, even if the source voltage Vcc varies over a predetermined voltage, for example, 4 [V], the output voltage Vout is fixed at an expected or designed voltage as long as the temperature is kept constant shown in FIG. 6. In addition, the level shifter 51 is a simple in structure because only one differential amplifier 33 is included therein.

What is claimed is:

1. A level shifter formed within a semiconductor substrate for shifting a source voltage supplied with a source terminal to supply a level shifted voltage for a level shifted voltage supplying terminal, said level shifter comprising;

a first integrated-circuit resistor formed within said semiconductor substrate and having a first temperature characteristic and a first line width;

a second integrated-circuit resistor formed within said semiconductor substrate to be connected between said source terminal and said first integrated-circuit resistor and having a second temperature characteristic and a second line width which are equal to said first temperature characteristic and said first line width, respectively;

a third integrated-circuit resistor formed within said semiconductor substrate and connected to said second integrated-circuit resistor in parallel and having a third temperature characteristic which is different from said first and said second temperature characteristics for dividing said source voltage together with said first and said second integrated-circuit resistors to produce a divided voltage; and output means formed on said semiconductor substrate and connected to a common point of connection among said first, said second, and said third integrated-circuit resistors and said level shifted voltage supplying terminal for supplying said divided voltage to said level shifted voltage supplying terminal as said level shifted voltage.

2. A level shifter as claimed in claim 1, wherein said output means is a differential amplifier which has a noninverting terminal connected to said common point, an output terminal connected to said level shifted voltage supplying terminal, and an inverting terminal connected to said output terminal.

3. A level shifter as claimed in claim 1, wherein said first, said second, and third integrated-circuit resistors comprise polycrystalline silicon:

said first integrated-circuit resistor has a first impurity concentration;

said second integrated-circuit resistor has a second impurity concentration which is equal to said first impurity concentration; and said third integrated-circuit resistor has a third imparity concentration which is different from each of said first and second-impurity concentrations.

4. A level shifter as claimed in claim 3, wherein said first integrated-circuit resistor has a first resistivity and a first activation energy:

said second integrated-circuit resistor has a second resistivity and a second activation energy which are equal to said first resistivity and said first activation energy, respectively; and said third integrated-circuit resistor has a third resistivity and a third activation energy which are different from each of said first and said second resistivities and each of said first and said second activation energy, respectively.

5. A level shifter as claimed in claim 1, wherein said third integrated-circuit resistor has a first resistance, said second integrated-circuit resistor has a second resistance, and said first resistance is bigger than said second resistance.

6. A level shifter formed within a semiconductor substrate for shifting a source voltage supplied with a source terminal to supply a level shifted voltage for a level shifted voltage supplying terminal, said level shifter comprising:

a first integrated-circuit resistor formed within said semiconductor substrate and having a first temperature characteristic and a first line width;

a second integrated-circuit resistor formed within said semiconductor substrate to be connected between said level shifted voltage supplying terminal and said first integrated-circuit resistor and having a second temperature characteristic and a second line width which are equal to said first temperature characteristic and said first line width, respectively;

a third integrated-circuit resistor formed within said semiconductor substrate and connected to said first integrated-circuit resistor in parallel and having a third temperature characteristic which is different from each of said first and said second temperature characteristics for dividing said level shifted voltage together with said first and said second integrated-circuit resistors to produce a divided voltage;

a constant voltage generating circuit formed within said semiconductor substrate for generating a constant voltage;

a differential amplifier formed within said semiconductor substrate and having a noninverting terminal connected to said constant voltage generating circuit, a inverting terminal connected to a common point of connection among said first, said second, and said third integrated-circuit resistors, and an output terminal for producing a control voltage in response to said constant voltage and said divided voltage;

and a transistor formed within said semiconductor substrate and connected to said source terminal, said level shifted voltage supplying terminal, and said output terminal for shifting said source voltage in response to said control voltage to supply said level shifted voltage to said level shifted voltage supplying terminal.

7. A level shifter as claimed in claim 6, wherein said first, said second, and third integrated-circuit resistors comprise polycrystalline silicon:

said first integrated-circuit resistor has a first impurity concentration;

said second integrated-circuit resistor has a second impurity concentration which is equal to said first impurity concentration; and said third integrated-circuit resistor has a third impurity concentration which is different from each of said first and second impurity concentrations.

8. A level shifter as claimed in claim 7, wherein said first integrated-circuit resistor has a first resistivity and a first activation energy;

said second integrated-circuit resistor has a second resistivity and a second activation energy which are equal to said first resistivity and said first activation energy, respectively; and said third integrated-circuit resistor has a third resistivity and a third activation energy which are different from each of said first and said second resistivities and each of said first and said second activation energy, respectively.

9. A level shifter as claimed in claim 6, wherein said first integrated-circuit resistor has a first resistance, said third integrated-circuit resistor has a second resistance, and said second resistance is bigger than said first resistance.

10. A method of manufacturing a level shifter formed within semiconductor substrate for shifting a source voltage supplied with a source terminal to supply a level shifted voltage to a level shifted voltage supplying terminal said method comprising the steps of:

forming, within the semiconductor substrate, a first integrated-circuit resistor which has a first temperature characteristic and a first line width;

forming, within the semiconductor substrate, a second integrated-circuit resistor by simultaneously with said first integrated-circuit resistor, said second-integrated circuit resistor being connected between said source terminal and said first integrated-circuit resistor and having a second temperature characteristic and a second line width which are substantially equal to said first temperature characteristic and said first line width, respectively;

forming, within the semiconductor substrate, a third integrated-circuit resistor which is connected to said second integrated-circuit resistor in parallel and which has a third temperature characteristic different from each of said first and said second temperature characteristics, said third integrated-circuit resistor being for dividing said source voltage together with said first and said second integrated-circuit resistors to produce a divided voltage; and attaching an output circuit within said semiconductor substrate to a common point of connection among said first, said second, and said third integrated-circuit resistors and said level shifted voltage supplying terminal for supplying said dividing voltage to said level shifted voltage-supplying terminal as said level shifted voltage.

11. A method of manufacturing a level shifter formed within a semiconductor substrate for shifting a source voltage supplied with a source terminal to supply a level shifted voltage for a level shifted voltage supplying terminal, said method comprising the steps of;

forming, within said semiconductor substrate, a first integrated-circuit resistor which has a first temperature characteristic and a first-line width;

forming, within said semiconductor substrate, a second integrated-circuit resistor by simultaneously with said first integrated-circuit resistor, said second integrated-circuit resistor being connected between said level shifted voltage supplying terminal and said first integrated-circuit resistor and having a second temperature characteristic and a second tine width which are equal to said first temperature characteristic and said first line width, respectively;

forming, within said semiconductor substrate, a third integrated-circuit resistor which is connected to said first integrated-circuit resistor in parallel and which has a third temperature characteristic different from each of said first and said second temperature characteristics, said third integrated-circuit resistor being for dividing said level shifted voltage together with said first and said second integrated-circuit resistors to produce a divided voltage;

forming, within said semiconductor substrate, a constant voltage generating circuit which generates a constant voltage, forming, within said semiconductor substrate, a differential amplifier which has a noninverting terminal connected to said constant voltage generating circuit, a inverting terminal connected to a common point of connection among said first, said second, and said third integrated-circuit resistors, and an output terminal for producing a control voltage in response to said constant voltage and said divided voltage; and forming, within said semiconductor substrate, a transistor which is connected to said source terminal, said level shifted voltage supplying terminal, and said output terminal and which shifts said source voltage in response to said control voltage to supply said level shifted voltage for said level shifted voltage supplying terminal.

* * * * *